(12) United States Patent
Shih et al.

(10) Patent No.: US 8,993,442 B2
(45) Date of Patent: Mar. 31, 2015

(54) INTERCONNECT STRUCTURE AND METHOD FOR FORMING THE SAME

(71) Applicant: Taiwan Semiconductor Manufacturing Company, Ltd., Hsin-Chu (TW)

(72) Inventors: Po-Cheng Shih, Hsinchu (TW); Joung-Wei Liou, Zhudong Town (TW); Chih-Hung Sun, Hsin-Chu (TW); Chia Cheng Chou, Keelung (TW); Kuang-Yuan Hsu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/974,430

(22) Filed: Aug. 23, 2013

(65) Prior Publication Data

US 2015/0056802 A1     Feb. 26, 2015

(51) Int. Cl.
*H01L 21/44* (2006.01)
*H01L 23/48* (2006.01)
*H01L 23/52* (2006.01)
*H01L 29/40* (2006.01)
*H01L 21/768* (2006.01)

(52) U.S. Cl.
CPC .... *H01L 21/76802* (2013.01); *H01L 21/76877* (2013.01)

USPC ........... 438/687; 438/666; 257/758; 257/762; 257/774

(58) Field of Classification Search
CPC ................. H01L 21/76802; H01L 21/76807; H01L 21/76877; H01L 21/76832; H01L 21/76843; H01L 21/76846; H01L 23/53238; H10L 24/11
USPC ......... 438/666, 618, 628, 687, 669, 674, 675; 257/758, 762, 774
See application file for complete search history.

(56) References Cited

U.S. PATENT DOCUMENTS

| | | | |
|---|---|---|---|
| 7,737,052 B2* | 6/2010 | Bhatia et al. | 438/787 |
| 2004/0187304 A1* | 9/2004 | Chen et al. | 29/830 |
| 2005/0006776 A1* | 1/2005 | Lin et al. | 257/762 |
| 2007/0249159 A1* | 10/2007 | Tsai et al. | 438/637 |
| 2008/0153283 A1* | 6/2008 | Abdelrahman et al. | 438/618 |

* cited by examiner

Primary Examiner — Karen Kusumakar
(74) Attorney, Agent, or Firm — Slater & Matsil, L.L.P.

(57) ABSTRACT

Embodiments of an interconnect structure and methods for forming an interconnect structure are provided. The method includes forming a low-k dielectric layer over a substrate, forming an opening in the low-k dielectric layer, forming a conductor in the opening, forming a capping layer over the conductor, and forming an etch stop layer over the capping layer and the low-k dielectric layer. The etch stop layer includes an N element with a content ratio not less than about 25 at %.

20 Claims, 4 Drawing Sheets

INTERCONNECT STRUCTURE AND METHOD FOR FORMING THE SAME

TECHNICAL FIELD

The present disclosure relates to semiconductor devices and particularly to copper interconnects and methods for their fabrication.

BACKGROUND

Semiconductor devices are used in a variety of electronic applications, such as personal computers, cell phones, digital cameras, and other electronic equipment. As technology has progressed, the demand for smaller semiconductor devices with improved performance has increased. As feature densities in the semiconductor devices increase, the widths of the conductive lines, and the spacing between the conductive lines of back-end of line (BEOL) interconnect structures in the semiconductor devices also need to be scaled down.

Several approaches have been implemented in order to meet these demands. As the widths of the conductive lines reduce, the spacing between two successive layers with conductive lines also reduces. The reduced spacing may therefore increase resistance-capacitance (RC) time delay. To reduce the RC time delay, low dielectric constant (low-k) materials are being used as insulating materials, and copper is replacing aluminum for interconnect structures. Advantages of using copper for semiconductor device interconnects include abilities to operate faster and manufacture thinner conductive lines because copper has lower resistivity and increased electromigration resistance compared to aluminum. Combining copper interconnects with low-k dielectric materials increases interconnect speed by reducing the RC time delay, for example.

Copper interconnects are often formed using damascene processes rather than by direct etching. Damascene processes are typically either single or dual damascene, which include forming openings by patterning and etching inter-metal dielectric (IMD) layers and filling the openings with copper. However, there are some challenges in the copper damascene structure, such as stress migration (SM) issues between the copper interconnects. The stress migration issues may cause device reliability failure.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
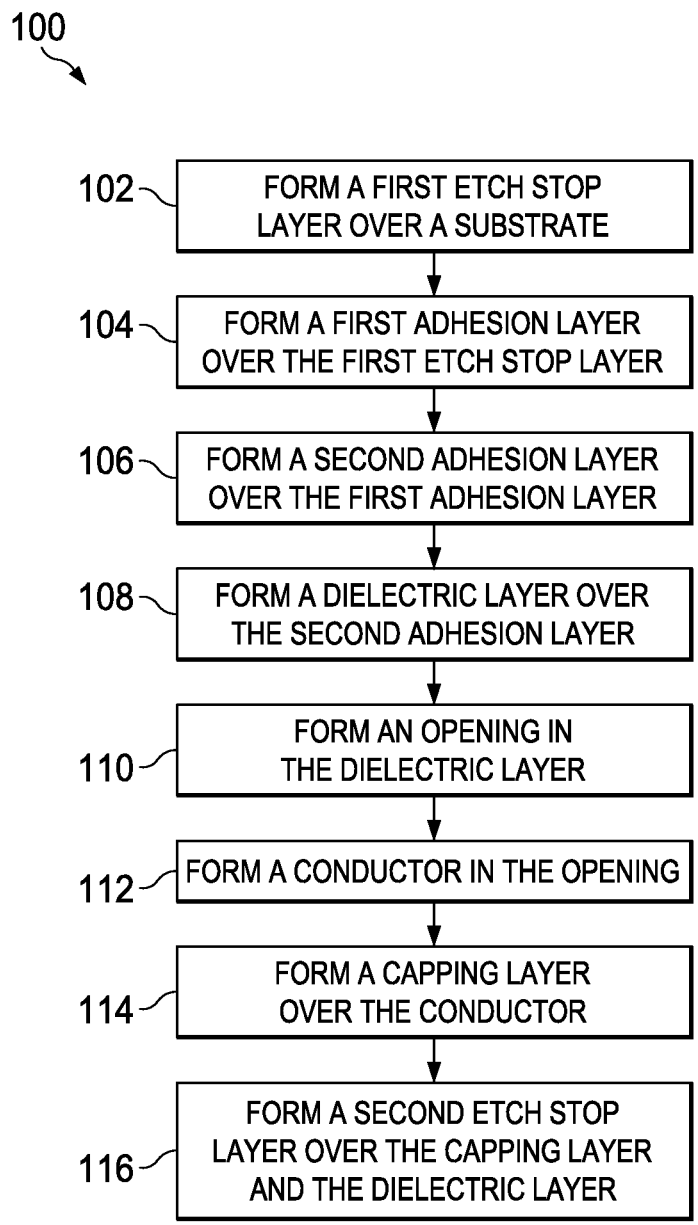
FIG. 1 is a flow chart of a method for fabricating an integrated circuit device according to an embodiment of the present disclosure.

It is understood that the following disclosure provides many different embodiments, or examples, for implementing different features of the disclosure. Specific examples of components arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-8, a method 100 and a semiconductor device 200 are collectively described below. The semiconductor device 200 illustrates an integrated circuit, or portion thereof, that can include memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be performed before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
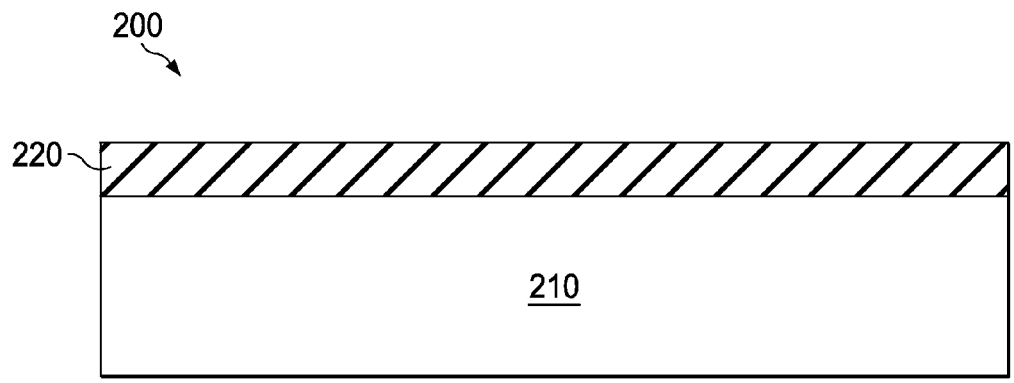
FIGS. 2-8 are cross-sectional views of an integrated circuit device during various fabrication stages according to the method of FIG. 1 according to an embodiment of the present disclosure.

Referring to FIGS. 1 and 2, the method 100 begins at step 102, wherein a first etch stop layer (ESL) 220 is formed over a substrate 210. In the present embodiment, the substrate 210 is a semiconductor substrate comprising silicon. In some alternative embodiments, the substrate 210 includes an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some embodiments, the semiconductor substrate may include a doped epitaxial layer. In other embodiments, the silicon substrate may include a multilayer compound semiconductor structure.

The substrate 210 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 210, in a P-well structure, in an N-well structure, in a dual-well structure, or using a raised structure. The semiconductor device 200 may include a P-channel Field Effect Transistor (PFET) device and/or an N-channel Field Effect Transistor (NFET)

device. Thus, the substrate 210 may include various doped regions configured for the PFET device and/or the NFET device.

The first etch stop layer 220 for controlling the end point during subsequent etching processes is deposited on the above-described substrate 210. In some embodiments, the first etch stop layer 220 includes a material having C, Si, N, or H. In some embodiments, the first etch stop layer 220 is formed of silicon oxide, silicon nitride, silicon carbide, silicon oxynitride, or combinations thereof. In the present embodiment, the first etch stop layer 220 is SiCN. The base composition of SiCN, for example, includes Si content ratio less than about 50 at % (atomic percent), C content ratio ranging from about 5 at % to about 25 at %, and N content ratio ranging from about 25 at % to about 40 at %. In some embodiments, the first etch stop layer 220 has a dielectric constant ranging from about 5.7 to about 6.8. In some embodiments, the first etch stop layer 220 has a thickness of about 10 angstroms to about 300 angstroms.

In some embodiments, the first etch stop layer 220 is formed through any of a variety of deposition techniques, including, low-pressure chemical vapor deposition (LPCVD), atmospheric-pressure chemical vapor deposition (APCVD), plasma-enhanced chemical vapor deposition (PECVD), physical vapor deposition (PVD), sputtering, and future-developed deposition procedures. In some alternative embodiments, the first etch stop layer 220 is formed by a thermal process.

Figure 3:
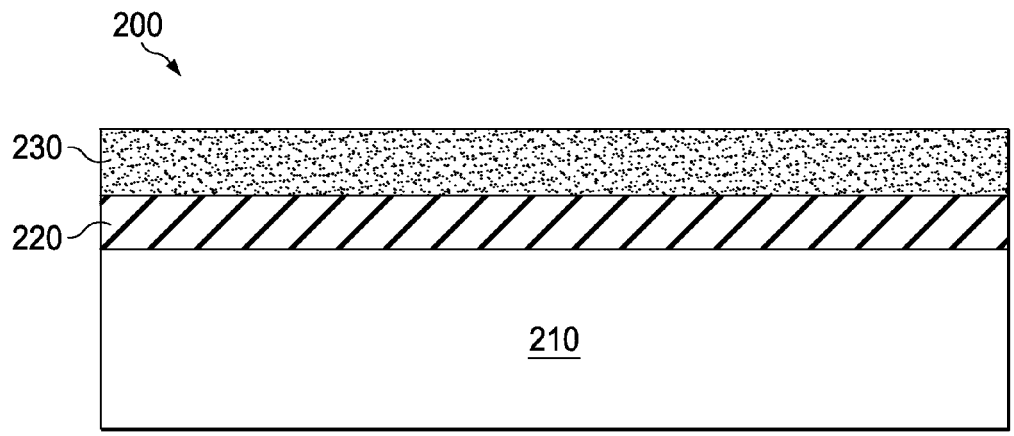

Referring to FIGS. 1 and 3, the method 100 continues with step 104 in which a first adhesion layer 230 is formed over the first etch stop layer 220. In some embodiments, the first adhesion layer 230 includes SiOx-containing material, SiCN-containing material, SiON-containing material, or combinations thereof. In some embodiments, the first adhesion layer 230 is formed using LPCVD process, APCVD process, PECVD process, PVD process, sputtering, or future-developed deposition procedures. In some alternative embodiments, the first adhesion layer 230 is formed using a thermal process. In the present embodiment, the first adhesion layer 230 is tetraethoxysilane (TEOS). In some embodiments, the first adhesion layer 230 has a thickness ranges from about 100 Angstroms to about 400 Angstroms.

Figure 4:
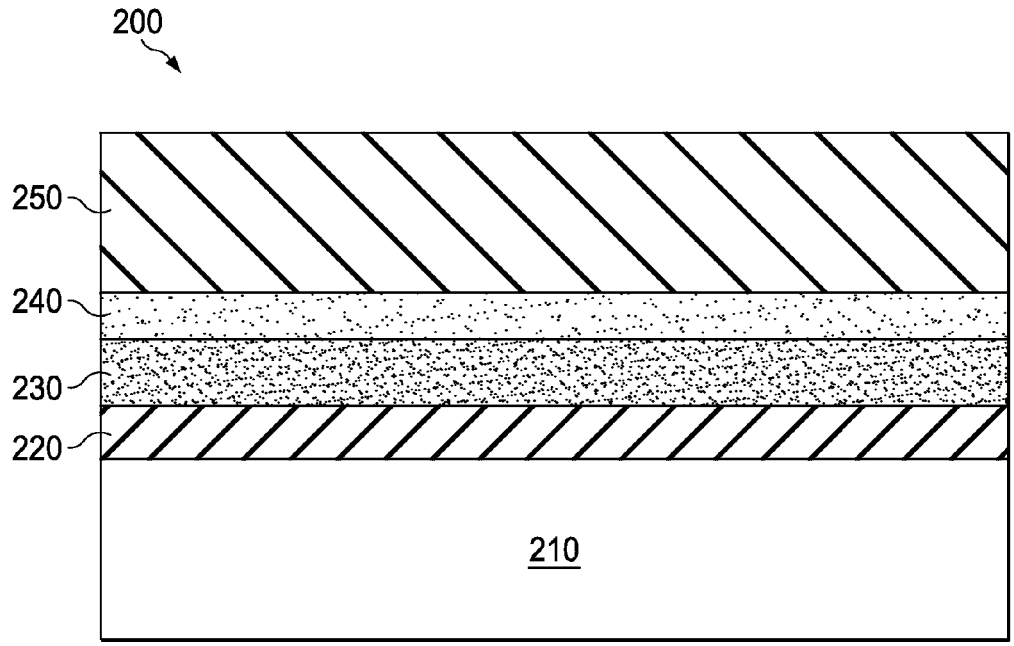

Referring to FIGS. 1 and 4, the method 100 continues with step 106 in which a second adhesion layer 240 is formed over the first adhesion layer 230. In some embodiments, the second adhesion layer 240 is formed using LPCVD process, APCVD process, PECVD process, PVD process, sputtering, or future-developed deposition procedures. In some alternative embodiments, the second adhesion layer 240 is formed using a thermal process. In some embodiments, the second adhesion layer 240 comprises a material including Si, C, O, or H. In some embodiments, the second adhesion layer 240 is a C-containing layer with a carbon content (C content) ratio in the base composition being greater than 13 at % (atomic percent). In some alternative embodiments, the second adhesion layer 240 is a C-containing layer with C content ratio in the base composition ranging from about 15 at % to about 30 at %. In some embodiments, the second adhesion layer 240 has a thickness ranges from about 5 Angstroms to about 300 Angstroms.

Still referring to FIGS. 1 and 4, the method 100 continues with step 108 in which a dielectric layer 250 is formed over the second adhesion layer 240. The dielectric layer 250 may be a single layer or a multi-layered structure. In some embodiments, the dielectric layer 250 is formed using CVD process, such as PECVD process, LPCVD process, or ALD process. In some embodiments, the dielectric layer 250 comprises a material including Si, C, O, or H. In some embodiments, the dielectric layer 250 comprises the same elements as the second adhesion layer 240 but with a C content ratio less than the C content ratio of the second adhesion layer 240. In some embodiments, the dielectric layer 250 is a C-containing layer with a C content ratio less than about 13 at %. In some alternative embodiments, the dielectric layer 250 is a C-containing layer with a C content ratio ranging from about 10 at % and to about 13 at %. In some embodiments, the dielectric layer 250 has a thickness ranges from about 300 Angstroms to about 2500 Angstroms.

In some embodiments, the second adhesion layer 240 and the dielectric layer 250 are continuously formed by PECVD. In some embodiments, the second adhesion layer 240 and the dielectric layer 250 use at least one precursor, such as tetramethylcyclotetrasiloxane (TMCTS), octamethylcyclotetrasiloxane (OMCTS), diethoxymethylsilane (DEMS), diethoxyldimethylsilane (DEDMS) and other related cyclic and non-cyclic silanes and siloxanes. In some embodiments, the precursor may be used in conjunction with an inert gas such as He or Ar and/or a reactant gas such as $H_2O$, $O_2$, and/or $CO_2$. In some embodiments, the second adhesion layer 240 and the dielectric layer 250 are continuously formed by PECVD with the same precursor and inert gas. In some embodiments, the second adhesion layer 240 and the dielectric layer 250 are continuously formed by PECVD with the same precursor and inert gas, but with different flow rates of the inert gas and/or different RF powers. In some embodiments, a flow rate of the inert gas for forming the second adhesion layer 240 is greater than a flow rate of the inert gas for forming the dielectric layer 250. In some alternative embodiments, the second adhesion layer 240 is formed using a RF power greater than a RF power for forming the dielectric layer 250. In at least one embodiment, a flow rate of an inert gas for forming the second adhesion layer 240 is greater than a flow rate of the inert gas for forming the dielectric layer 250 and a RF power for forming the second adhesion layer 240 is greater than a RF power for forming the dielectric layer 250.

In some embodiments, the dielectric layer 250 is a low dielectric constant (low-k) layer having a dielectric constant of less than 3.0 and functions as an inter-metal dielectric (IMD) layer. In some embodiments, the dielectric layer 250 is a low-k layer having a dielectric constant ranging from about 2.3 to about 2.6. A wide variety of low-k materials may be employed in accordance with embodiments, for example, spin-on inorganic dielectrics, spin-on organic dielectrics, porous dielectric materials, organic polymer, organic silica glass, SiOF series material (FSG), hydrogen silsesquioxane (HSQ) series material, methyl silsesquioxane (MSQ) series material, or porous organic series material.

In some embodiments, the second adhesion layer 240 has a dielectric constant substantially the same as the dielectric constant of the dielectric layer 250. In some alternative embodiments, the second adhesion layer 240 has a dielectric constant slightly greater than the dielectric constant of the dielectric layer 250, e.g., the different of dielectric constants is less than about 2%. In some embodiments, the second adhesion layer 240 functions as an adhesion promotion layer to improve adhesion between the dielectric layer 250 and the first adhesion layer 230. Measured adhesion values that can be obtained by using the second adhesion layer 240 are about 14 $J/m^2$ or greater. The measured adhesion values are higher than those in which no further adhesion layer is present between the dielectric layer 250 and the first adhesion layer 230 by about 7% or greater.

Figure 5:
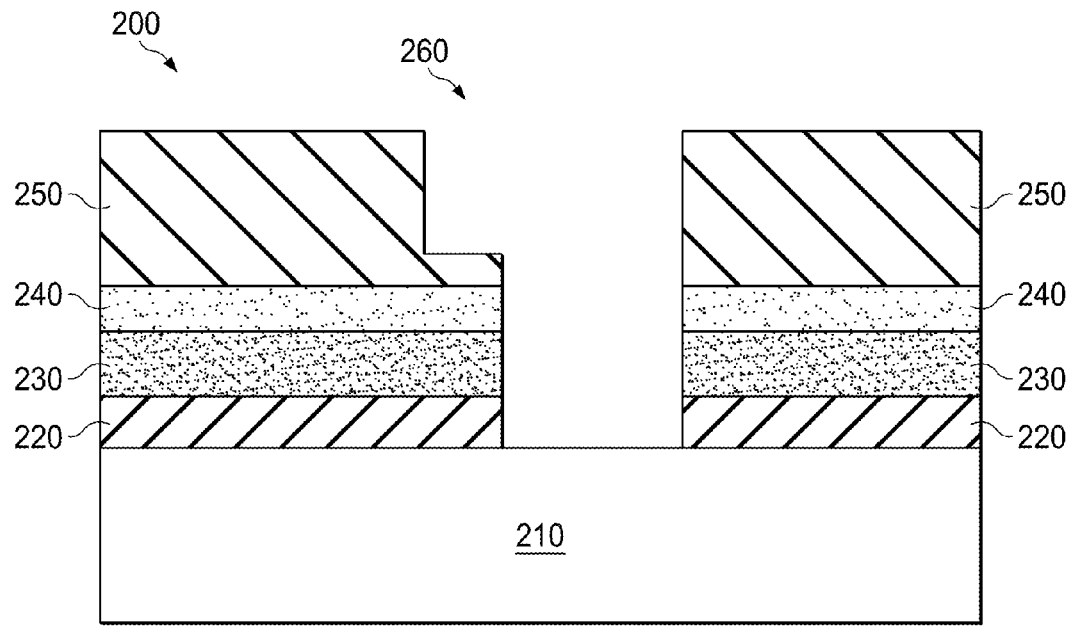

Referring to FIGS. 1 and 5, the method 100 continues with step 110 in which an opening 260 is formed in the dielectric layer 250. In some embodiments, the opening 260 is formed through the dielectric layer 250, the second adhesion layer 240, the first adhesion layer 230, and the first etch stop layer 220. In some embodiments, the opening 260 is a dual damascene opening including an upper trench section 260a and a lower via-hole section 260b to define a contact region. Although the embodiments illustrate a dual damascene opening in the dielectric layer 250, the method disclosed in the present application is applicable for an embodiment having single damascene openings in the IMD layer. In dual damascene techniques including a "via-first" patterning method or a "trench-first" patterning method, the upper trench section 260a and the lower via-hole section 260b may be formed using typical lithographic with masking technologies and anisotropic etch operations (e.g. plasma etching or reactive ion etching). A bottom etch stop layer, a middle etch stop layer, a polish stop layer, or an anti-reflective coating (ARC) layer may be optionally deposited on or intermediately in the dielectric layer 250, providing a clear indicator of when to end a particular etching process.

Figure 6:
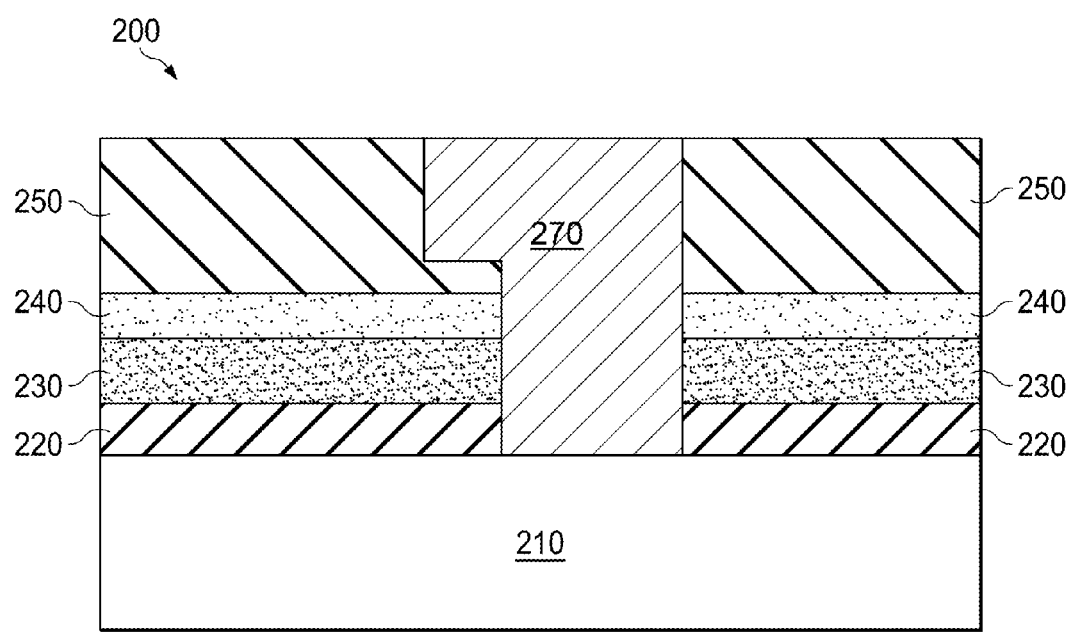

Referring to FIGS. 1 and 6, the method 100 continues with step 112 in which a conductor 270 is formed in the opening 260. In some embodiments, the conductor 270 is formed by a deposition process, e.g., electro-chemical plating (ECP). In some embodiments, the conductor 270 contains at least one main metal element, e.g., copper (Cu). In some alternative embodiments, the conductor 270 further contains an additive metal element different from the main metal element, such as aluminum.

Still referring to FIG. 6, a barrier layer (not shown) may be deposited to line the sidewalls the openings 260 before forming the conductor 270. In some embodiment, the barrier layer includes Ti, TiN, Ta, TaN, other proper material, or combinations thereof. A conductive seed layer (not shown) may be further formed over the barrier layer before forming the conductor 270. In at least one embodiment, the conductive seed layer is a metal alloy layer containing at least a main metal element, e.g., copper (Cu). In at least one embodiment, the conductive seed layer is formed by using PVD, CVD, PECVD, LPCVD, or other well-known deposition techniques. A chemical mechanical polishing (CMP) process may be performed after the formation of the conductor 270 to remove the excess portions of the conductor 270 over the dielectric layer 250, thus exposing the top surface of the dielectric layer 250 and achieving a planarized surface.

Figure 7:
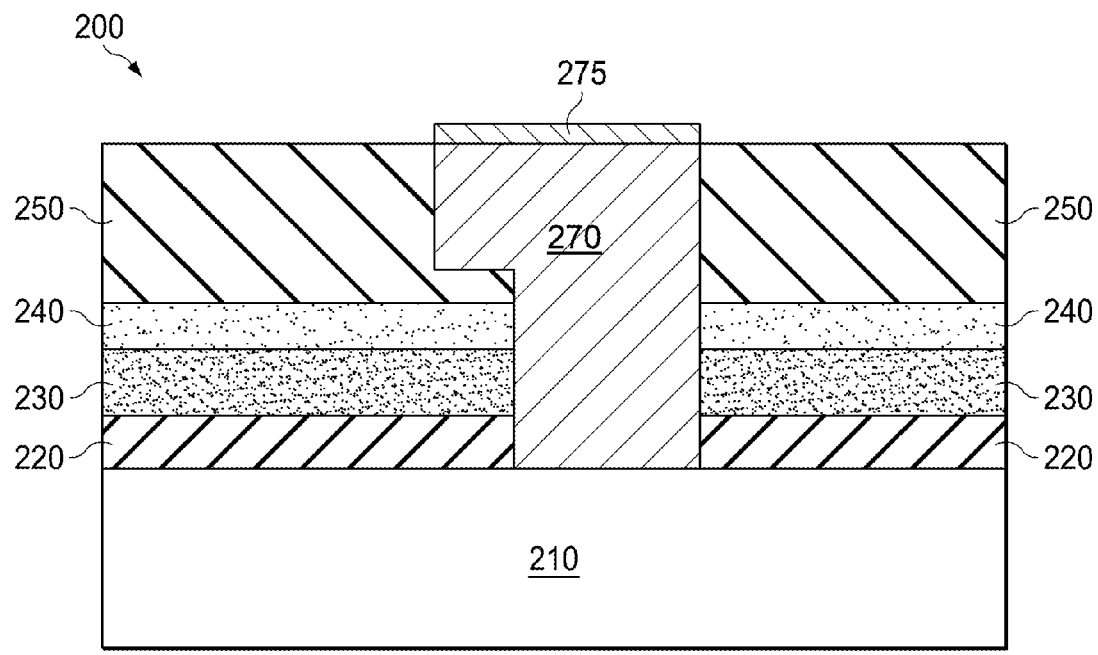

Referring to FIGS. 1 and 7, the method 100 continues with step 114 in which a capping layer 275 is formed on the top surface of the conductor 270. The capping layer 275 may enhance adhesion between the underlying conductor 270 and a subsequently formed second etch stop layer (ESL) 280. In some embodiments, the capping layer 275 has a thickness ranging from about 5 angstroms to about 50 angstroms formed by a deposition process including LPCVD, APCVD, PECVD, PVD, or sputtering. A top surface of the capping layer 275 is substantially higher than the top surface of the conductor 270. Alternatively, the top surface of the capping layer 275 may be coplanar with the conductor 270.

The capping layer 275, for example, is a metal-containing layer. In some embodiments, the capping layer 275 includes Co, CoWP, AlN, or combinations thereof. In the present embodiment, the capping layer 275 includes a Co layer formed by introducing a cobalt-containing gas such as CPCo $(CO)_2$ and $NH_3$ in a chamber in which the semiconductor device 200 is being processed. In embodiments, the capping layer 275 is selectively formed on the conductor 270. In alternative embodiments, the capping layer 275 is formed entirely over the semiconductor device 200 and then subjected to a patterning process to remove the portion of capping layer 275 on the dielectric layer 250, while leaving another portion of capping layer 275 on the conductor 270.

Figure 8:
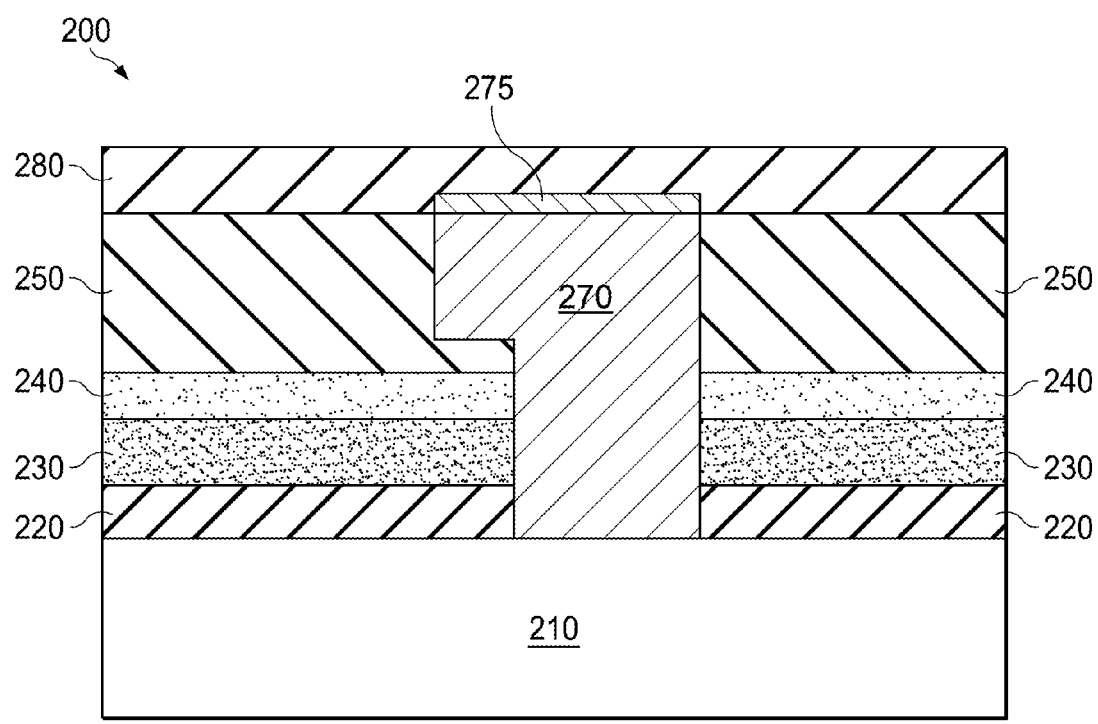

Referring to FIGS. 1 and 8, the method 100 continues with step 116 in which the second etch stop layer 280 is formed on the capping layer 275 and the dielectric layer 250. The second etch stop layer 280 may control the end point during subsequent etching processes. In some embodiments, the second etch stop layer 280 includes a material the same as the material of first etch stop layer 220. In alternative embodiments, the second etch stop layer 280 includes a material different from the material of first etch stop layer 220. In some embodiments, the second etch stop layer 280 includes a material having C, Si, N, or H. In some embodiments, the second etch stop layer 280 is formed of silicon oxide, silicon nitride, silicon carbide, silicon oxynitride, or combinations thereof. In the present embodiment, the second etch stop layer 280 is SiCN. In some embodiments, the C content ratio in the base composition of SiCN ranges from about 5 at % to about 25 at % to achieve a dielectric constant less than about 7.0. The base composition of SiCN, for example, includes Si content ratio less than about 50 at %, C content ratio ranging from about 5 at % to about 25 at %, and N content ratio ranging from about 25 at % to about 40 at %. In some embodiments, the second etch stop layer 280 has a dielectric constant ranging from about 5.7 to about 6.8. In some embodiments, the second etch stop layer 280 has a thickness of about 10 angstroms to about 300 angstroms.

In some embodiments, the second etch stop layer 280 is formed through any of a variety of deposition techniques, including, low-pressure chemical vapor deposition (LPCVD), atmospheric-pressure chemical vapor deposition (APCVD), plasma-enhanced chemical vapor deposition (PECVD), physical vapor deposition (PVD), sputtering, and future-developed deposition procedures. In some alternative embodiments, the second etch stop layer 280 is formed by a thermal process.

In the case of the capping layer 275 containing Co or Al element and the underlying conductor 270 containing Cu element, a strong bond is formed between the Co or Al element and the Cu element. In the case of the capping layer 275 containing Co or Al element and the overlying second etch stop layer 280 containing N element with a content ratio greater than a pre-determined value (e.g., >=about 25 at %), a strong bond is formed between the Co or Al element and the N element. The presence of strong bond can improve stress migration (SM) of the device 200. In some embodiments, the N element in the second etch stop layer 280 is not greater than about 40 at % to control the stress of the second etch stop layer 280 within an acceptable value.

It is noted that the method described above in conjunction with FIGS. 2-8 is merely exemplary. One of skill in the art can modify the flow of the method to achieve desired semiconductor device.

In summary, the disclosed methods and integrated circuit devices result in improved device performance, including but not limited to, improved adhesion between the IMD layer and the underlying layer, and thus the peeling issue can be suppressed. Further, it can improve current leakage between metal lines to prevent device being degraded by time-dependent dielectric breakdown (TDDB). Furthermore, it can enhance device reliability.

In at least one embodiment, a method includes forming a low-k dielectric layer over a substrate; forming an opening in the low-k dielectric layer; forming a conductor in the opening; forming a capping layer over the conductor; and forming an etch stop layer over the capping layer and the low-k dielectric layer. The etch stop layer includes an N element with a content ratio ranging from about 25 at % to about 40 at %.

In another embodiment, a method, includes forming a first etch stop layer over a substrate; forming an adhesion layer over the first etch stop layer; forming a low-k dielectric layer over the adhesion layer; forming an opening in the low-k dielectric layer, the adhesion layer, and the first etch stop layer; forming a metal line in the opening; selectively forming a capping layer over the metal line; and forming a second etch stop layer over the capping layer and the low-k dielectric layer. The etch stop layer includes an N element with a content ratio ranging from about 25 at % to about 40 at %.

In still another embodiment, a semiconductor device, includes a low-k dielectric layer over a substrate; a conductor in the low-k dielectric layer; a capping layer over the conductor; and an etch stop layer over the capping layer and the low-k dielectric layer. The etch stop layer includes an N element with a content ratio ranging from about 25 at % to about 40 at %.

Although the embodiments have been described, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A method, comprising:
   forming a low-k dielectric layer over a substrate;
   forming an opening in the low-k dielectric layer;
   forming a conductor in the opening;
   forming a capping layer over the conductor; and
   forming an etch stop layer over the capping layer and the low-k dielectric layer, wherein the etch stop layer includes an N element with a content ratio ranging from about 25 at % to about 40 at %, and wherein the etch stop layer has a dielectric constant ranging from about 5.7 to about 6.8.

2. The method of claim 1, wherein the capping layer includes Co, CoWP, AlN, or combinations thereof.

3. The method of claim 1, wherein the capping layer is Co layer formed using $CPCo(CO)_2$ and $NH_3$.

4. The method of claim 1, wherein the etch stop layer is SiCN.

5. The method of claim 4, wherein the SiCN includes a C element with a content ratio ranging from about 5 at % to about 25 at %.

6. The method of claim 1, wherein the etch stop layer includes a Si element with a content ratio less than about 50 at %.

7. The method of claim 1, wherein the etch stop layer includes a C element with a content ratio ranging from about 5 at % to about 25 at %.

8. The method of claim 1, wherein the etch stop layer has a thickness ranging about 10 angstroms to about 300 angstroms.

9. The method of claim 1, wherein the low-k dielectric layer has a dielectric constant ranging from about 2.3 to about 2.6.

10. The method of claim 1, further comprising forming an adhesion layer under the low-k dielectric layer.

11. A method, comprising:
    forming a first etch stop layer over a substrate;
    forming an adhesion layer over the first etch stop layer;
    forming a low-k dielectric layer over the adhesion layer;
    forming an opening in the low-k dielectric layer, the adhesion layer, and the first etch stop layer;
    forming a metal line in the opening, wherein a surface of the metal line facing away from the substrate and a surface of the low-k dielectric layer facing away from the substrate are substantially co-planar;
    selectively forming a capping layer over the metal line; and
    forming a second etch stop layer over the capping layer and the low-k dielectric layer, wherein the etch stop layer includes an N element with a content ratio ranging from about 25 at % to about 40 at %.

12. The method of claim 11, wherein the adhesion layer comprises a second adhesion layer over a first adhesion layer.

13. The method of claim 11, wherein the capping layer includes Co, CoWP, AlN, or combinations thereof.

14. The method of claim 11, wherein a Co element in the capping layer forms a bond with the N element in the etch stop layer.

15. The method of claim 11, wherein a Co element in the capping layer forms a bond with a Cu element in the metal line.

16. The method of claim 11, wherein the capping layer is formed by introducing gases of $CPCo(CO)_2$ and $NH_3$ over the substrate.

17. A semiconductor device, comprising:
    a low-k dielectric layer over a substrate;
    a conductor in the low-k dielectric layer;
    a capping layer over the conductor; and
    an etch stop layer over the capping layer and the low-k dielectric layer, wherein the etch stop layer includes an N element with a content ratio ranging from about 25 at % to about 40 at %, and wherein the etch stop layer has a dielectric constant ranging from about 5.7 to about 6.8.

18. The semiconductor device of claim 17, wherein the capping layer includes Co, CoWP, AlN, or combinations thereof.

19. The semiconductor device of claim 17, wherein the low-k dielectric layer has a dielectric constant ranging from about 2.3 to about 2.6.

20. The semiconductor device of claim 17, wherein the etch stop layer includes a C element with a content ratio ranging from about 5 at % to about 25 at %.

* * * * *